(12) United States Patent
Underwood et al.

(10) Patent No.: US 6,515,222 B2
(45) Date of Patent: Feb. 4, 2003

(54) PRINTED CIRCUIT BOARD ARRANGEMENT

(75) Inventors: Jeffrey A. Underwood, Sunrise, FL (US); John K. Arledge, Ft. Lauderdale, FL (US); Thomas J. Swirbel, Davie, FL (US); Joaquin Barreto, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/775,460

(22) Filed: Feb. 5, 2001

(65) Prior Publication Data

US 2002/0104669 A1 Aug. 8, 2002

(51) Int. Cl.⁷ .................................................. H05K 9/00
(52) U.S. Cl. ........................ 174/35 R; 174/255; 361/816
(58) Field of Search .......................... 174/35 R, 255, 174/256, 157, 258, 250; 361/816, 818; 29/600, 825

(56) References Cited

U.S. PATENT DOCUMENTS

| | | | | |
|---|---|---|---|---|
| 5,677,515 A | * | 10/1997 | Selk et al. ................ | 174/250 |
| 5,981,869 A | * | 11/1999 | Kroger ...................... | 174/255 |
| 6,000,120 A | * | 12/1999 | Arledge et al. ............ | 29/600 |
| 6,020,219 A | * | 2/2000 | Dudderar et al. .......... | 438/118 |
| 6,388,205 B1 | * | 5/2002 | Chua ......................... | 174/261 |

* cited by examiner

Primary Examiner—Dean A. Reichard
Assistant Examiner—Carmelo Oliva
(74) Attorney, Agent, or Firm—Daniel C. Crilly; Randi L. Dulaney; Frank M. Scutch, III

(57) ABSTRACT

Methods and apparatus for forming a metal shield on a printed circuit board (10) include a layer of dielectric material (23) one or more printed circuits (21) on the layer of dielectric material (23), a layer of metal (27) on the layer of dielectric material (23), a metal-clad trench or opening surrounding the printed circuit (44) and electrically connected to the layer of metal(27), a solder pad (24) on the layer of dielectric material (23), a microvia (25) through the solder pad (24) and the layer of dielectric material (23), and electrical components (11) soldered to the solder pads (24) and to the printed circuit (21).

12 Claims, 4 Drawing Sheets

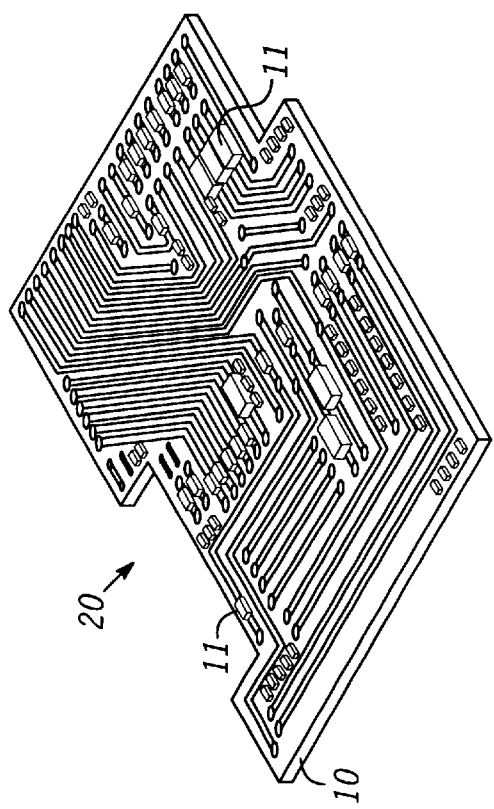
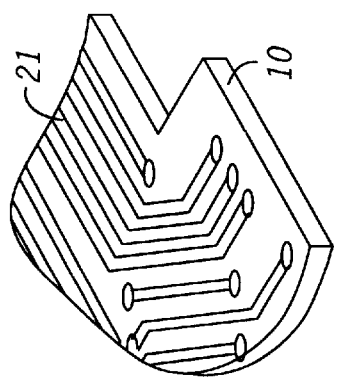
FIG. 1
FIG. 2

PRINTED CIRCUIT BOARD ARRANGEMENT

BACKGROUND OF THE INVENTION

1. Field of the Invention

This invention relates in general to the field of shielding printed circuit board circuits and in particular to methods and apparatus for shielding circuits on printed circuit boards utilizing high-density interconnect technology.

2. Description of the Prior Art

Printed circuit boards can contain many separate circuits where each circuit is generally arranged at a separate location on the board. Inasmuch as some circuits emit radiation, shields have been employed to prevent the radiation from reaching the environment outside of the circuit board. Typically, in the prior art, the circuit shields comprise formed metal cans or metalized plastic cans which encompass the circuit when mounted to the circuit board.

The prior art metal or metalized shielding cans necessarily utilize space on the circuit board. Circuit board space is a valuable commodity in today's technology. Smaller circuit boards and/or additional circuitry can result by increasing the useful space on a circuit board. Thus, what is needed are methods and apparatus for shielding circuits on a printed circuit board which reduce or minimize the space used by the shielding on the circuit board.

BRIEF DESCRIPTION OF THE DRAWINGS

Various other objects, advantages, and features of the invention will become apparent to those skilled in the art from the following discussion taken in conjunction with the following drawings, in which:

FIG. 1 schematically illustrates a typical printed circuit board which incorporates the present invention;

FIG. 2 schematically illustrates a portion of a printed circuit of the circuit board of FIG. 1;

DESCRIPTION OF THE PREFERRED EMBODIMENTS

Figure 3:
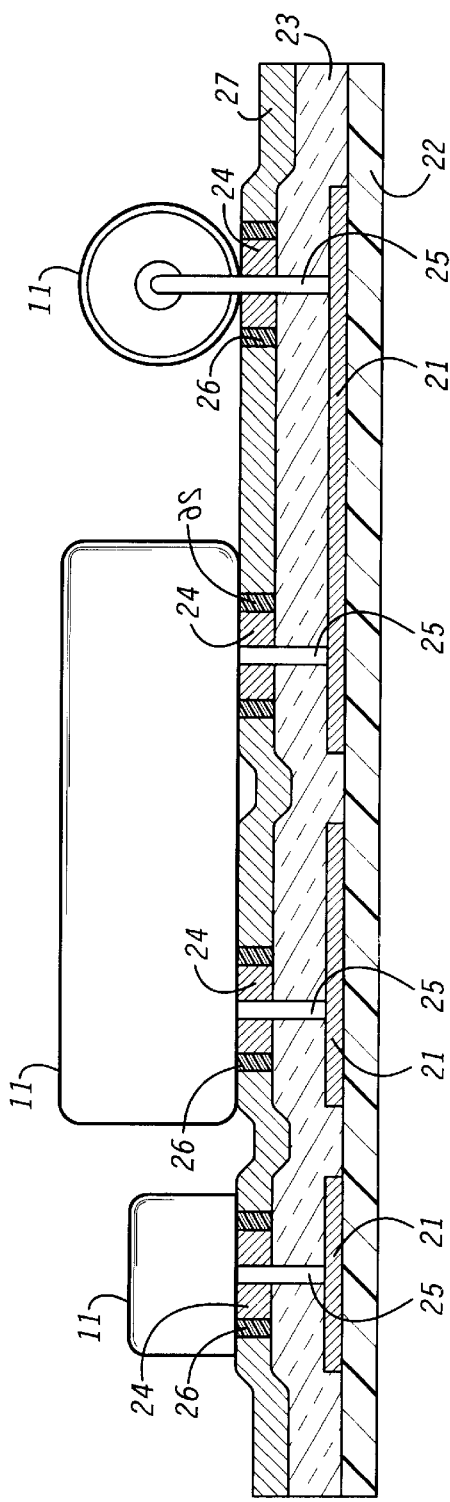
FIG. 3 schematically illustrates a cross-sectional view of one embodiment of the present invention.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Reference is made to the drawings, wherein like characteristics and features of the present invention shown in the various figures are designated by the same reference numerals.

Reference is now made to FIG. 1, which schematically illustrates, in cross section, a typical printed circuit board 10 which incorporates one embodiment 20 of the present invention. Circuit board 10, for example, can comprise one of several circuit boards or an entire circuit board of an electronic device such as a cell phone, a pager, a two-way radio, or other like analog or digital device. Circuit board 10 thus includes a plurality of circuits, connections between circuits, transmission lines, transistors, speakers, controls, microphones, and other like circuits, electrical apparatus, and components 11. Generally, a group of electrical circuits are arranged side-by-side to form a functional circuit block which generally performs a specific function within the overall circuitry of the printed circuit board 10.

FIG. 2 schematically illustrates one functional circuit block 21 of the printed circuit board 10 of FIG. 1. For example, functional block 12 may comprise the voltage control oscillator portion of the circuitry of a two-way radio. In this example, the electrical components 11 may include a resistor, a capacitor, and an inductor, as well as other like individual components which are commonly used on a printed circuit board.

FIG. 3 represents a basic embodiment 20 of the present invention. However, the various sizes and thicknesses shown in FIG. 3 are not proportional; rather, they are exaggerated to clarify the accompanying description. In this embodiment 20, high density interconnect (HDI) technology is used to form a metal shield over a circuit, a circuit block, or a portion of a circuit which is referred to hereinafter as circuit 21. A circuit 21 is printed on a substrate 22. Circuit 21 and substrate 22 are covered by a layer of dielectric material 23. A layer of metal 27 is deposited over the dielectric layer 23. A plurality of solder pads 24 are formed on the dielectric layer 23 at predetermined locations relative to circuit 21. A small non-metallic area 26 surrounds each solder pad 24. Each solder pad 24 includes a microvia 25 extending to the metal of circuit 21. One or more appropriate electrical components 11 are soldered to the circuit 21 using the solder pads 24 and the microvias 25 therethrough. In this manner, a metal shield is provided over a circuit or circuits 21 where the emitted radiation is not sensitive to the small non-metallic areas 26 surrounding the solder pads 24.

Referring still to FIG. 3, the substrate 22 is a typical insulating substrate used with a printed circuit board. The insulating substrate 22 can be of any material used in the electronics industry and is typically a material such as glass-reinforced epoxy laminate, glass-reinforced polyimide laminate, flexible polyimide or polyester or ceramic. Circuit 21 may be formed by any of the conventional methods known in the prior art, such as by photolithography and chemical etching. The layer of dielectric material 23 can comprise a photoimageable material such as photoresist, or other types of dielectric materials such as epoxy or polylaminate and appropriately deposited or applied over the circuit 21 and the substrate 22.

The metal layer 27 may be deposited by any conventional method such as photolithography. The solder pads 24 each comprise a small area of conductive material which allows for conventional soldering of a connection point of circuit 21 to an electrical component 11. In this embodiment, the solder pads 24 comprise the material from which the metal layer 27 is made and result by removing the metal of metal layer 27 from the small areas 26 surrounding each solder pad 24. The metal of layer 27 may be removed from areas 26 by, for example, chemical etching. The solder pads 24 are appropriately located above the circuit 21 where the electrical components are to be soldered.

The microvias 25 can be formed by any suitable high density interconnect (HDI) technology, including, but not limited to, photolithography, laser ablation, or plasma etching, depending upon the material used for the dielectric 22. The microvias 25 penetrate through the solder pads 24 and the dielectric material 22 to expose the metal of the circuit 21. The electrical components 11 are connected at the location of the solder pads 24 to circuit 21 by and conventional soldering method, such as by reflow soldering.

Figure 4:
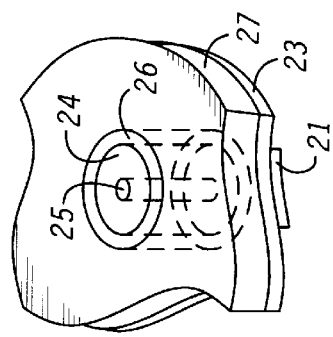
FIG. 4 schematically illustrates a solder pad portion of the upper surface of the printed circuit board of FIG. 1.

FIG. 4 schematically illustrates, the details of a solder pad 24 of FIG. 3 formed by the metal layer 27 and the small non-metallic area 26. The microvia 25 is seen to be provided at the approximate center of solder pad 24 and through the layer of dielectric 23. The non-metallic area 26 is not limited to any particular configuration; the only requirement is that the solder pad 24 be electrically isolated from the layer of metal 27. For example, the non-metallic areas 26 may be chemically etched from the metal layer 27 deposited by photolithography.

Figure 5:
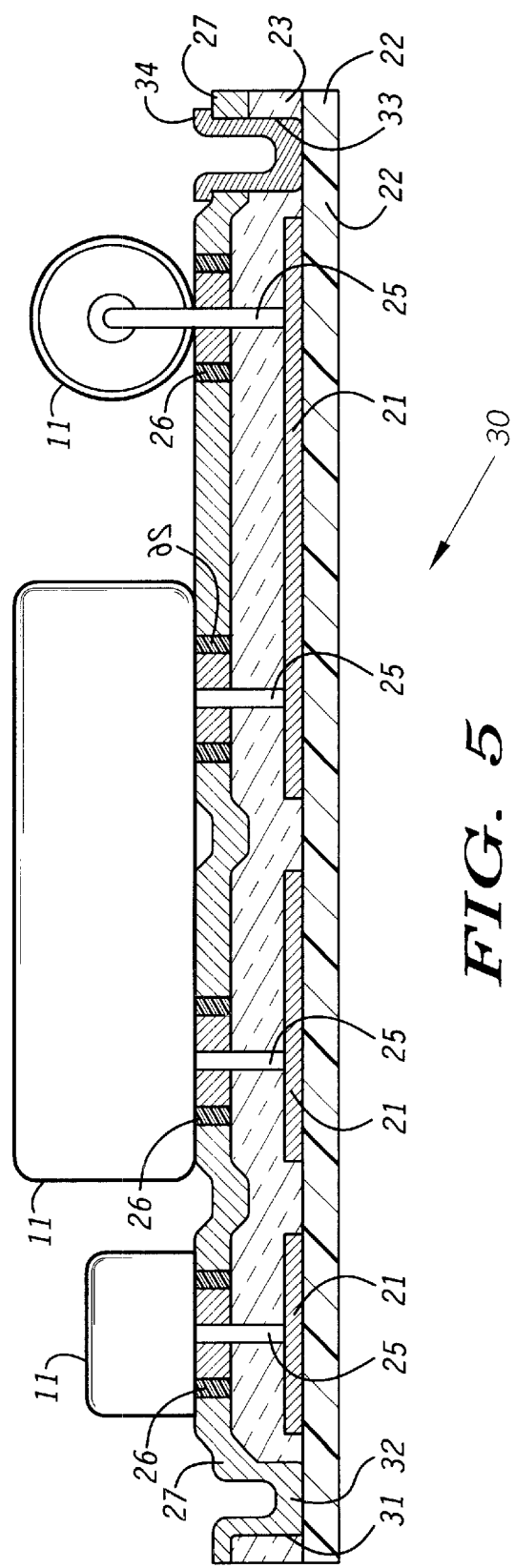
FIG. 5 schematically illustrates a cross-sectional view of another embodiment of the present invention.

FIG. 5 illustrates an embodiment 30, shown in cross section, comprising the embodiment of FIG. 3 with the addition of the metal shield extending down and around the sides of the external periphery of circuit 21.

The side shielding added by the embodiment of FIG. 5 can be effectuated by at least two ways. One method is to form a trench-like groove 31 in dielectric layer 23 and around the periphery of circuit 21 and then fill or plate the groove 31 with metal simultaneously with the depositing of metal layer 27. Here, the groove 31 may be formed by conventional photolithographic methods. The side shield 32 formed by this method is shown on the left side of FIG. 5.

Another method of forming a metal shield along and around the sides of circuit 21 is to form a trench-like groove 33 in both the metal layer 27 and the dielectric layer 23 and then filling or plating the groove 32 with metal. Here, the groove may be formed by laser ablation. The plating or filling of groove 32 can be accomplished by sputtering, electroless plating, ablative plating, or other like conventional means. The side shield 34 formed by this alternate method is shown on the right side of FIG. 5.

In either of the alternative methods described above in the embodiment 30 of FIG. 5, the metal shield 32 or 34 provided around the sides of circuit 21 makes electrical contact with the shielding provided by layer 27 along the interface of the shields. However, small gaps are permissible which can be used to provide electrical connections to and from the circuit 21. The top shield 27 and the connecting side shield 32 or 34 need not follow the constraints of a conventionally formed metal shield; rather, the shielding provided by the present invention can be form fitted tightly around any desired circuit 21 however irregular its periphery. It is therefore to be noted that the trench-like grooves 31 and 33 shown in FIG. 5 can be provided around a single circuit, around multiple circuits, and even around individual portions of a circuit or circuits, in order to insulate different functional blocks or circuits from each other. By selectively locating the grooves and filling or plating the same with metal and by electrically connecting the metal shield 27 to the metalized periphery of the circuit or circuits, very selective or complete top and side shielding can be effectuated. Small gaps or apertures transverse to the longitudinal axis of the side shielding can provide for circuit trace penetration and interfacing between and within the circuits. Indeed, the various combinations are substantially limitless and can be readily envisioned by one having skill in the art.

Figure 6:
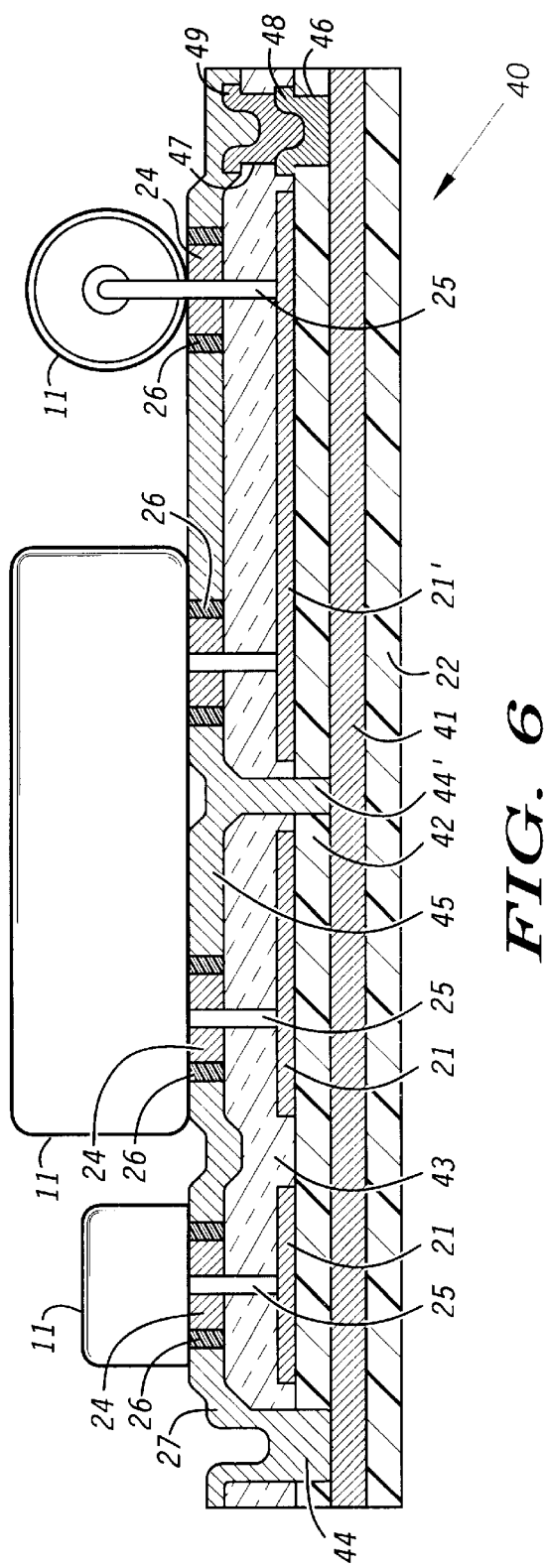
FIG. 6 schematically illustrates a cross-sectional view of yet another embodiment of the present invention; and, FIG. 7 schematically illustrates a cross-sectional view of even a further embodiment of the embodiment of FIG. 6 according to the present invention.

FIG. 6 illustrates an embodiment 40 where the methods and apparatus of the present invention provide complete top, side and bottom shielding around, for example, a circuit block using HDI technology. This embodiment 40 is shown in FIG. 6, where it is seen that a metal layer 41 is applied to a substrate 22. A first layer of dielectric 42 is applied over the metal layer 41. The printed circuits and circuit blocks 21 are deposited on the first layer of dielectric 42. A second dielectric layer 43 is applied over the first dielectric layer 42 and over the circuit 21. Trench-like grooves 44 are formed completely around the circuit or circuits 21 which are desired to be completely shielded. The grooves 44 penetrate through both layers of dielectric 42 and 43, exposing the metal in metal layer 41. A final layer of metal 45 is then deposited over dielectric layer 43 which simultaneously fills or plates the grooves 44, thereby electrically connecting the ground planes of metal layers 41 and 45. This method of shielding is seen on the left side of FIG. 6. As illustrated in FIG. 6, circuits 21, 21' disposed between the first and second dielectric layers 42, 43 may be shielded individually or in groups in accordance with the present invention. For example, additional metal clad openings 44' may be created as described herein and inserted between individual circuits 21' or groups of circuits 21, 21' to shield and isolate them from each other. In such a case, the additional metal clad openings 44' are electrically connected to the other grooves 44 through metal layers 41 and 27. The right side of FIG. 6 shows an alternative method of shielding. Here, after each dielectric layer 42 and 43 is deposited, a groove 46 and 47, is made in each layer, respectively. Each groove 46 and 47 is separately filled or plated with metal 48 and 49. Then the metal layer 45 is applied.

The substrate 22, dielectric layers 42 and 43, the metal layers 41 and 45, the grooves 44, 46 and 47 and the metallization of the grooves 44, 46 and 47 are formed or provided as explained above. The components 11 are connected to the circuit 21 using the solder pads 24 and methods described above. Trace interfacing and penetrations are also provided as described above.

Figure 7:
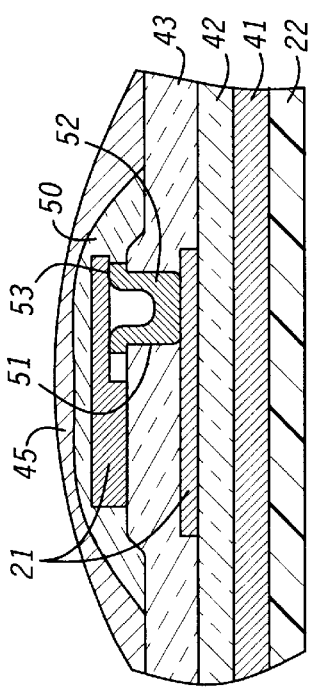

Should it be desired, the embodiment 40 of FIG. 6 can include circuit or circuit blocks 21 layered one on top of each other with a layer of dielectric 50 therebetween as shown in FIG. 7. One or more microvias 51 in the layer of dielectric 43 between the stacked circuits 21, which are then filled with metal 52, can provide for electrical connections 53 between the stacked circuits. It is to be noted that the above-described method of isolating different functional blocks can be applied to the embodiment of FIG. 6 with the result that the different circuit blocks can each be completely surrounded on all sides or completely encapsulated by a metal shield and thereby be shieldingly isolated from each other.

While the invention has been described, disclosed, illustrated and shown in certain terms or certain embodiments or modifications which it has assumed in practice, the scope of the invention is not intended to be nor should it be deemed to be limited thereby and such other modifications or embodiments as may be suggested by the teachings herein are particularly reserved especially as they fall within the breadth and scope of the claims here appended.

We claim as our invention:

1. A printed circuit board arrangement comprising:

a substrate;

a printed circuit deposited directly on said substrate;

a layer of dielectric material covering said substrate and said printed circuit;

a layer of metal deposited on said layer of dielectric material; and a metal clad opening surrounding said printed circuit, said metal clad opening being electrically connected to said layer of metal.

2. The printed circuit board arrangement of claim 1, including a gap in said metal clad opening.

3. The printed circuit board arrangement of claim 1, including an opening in said layer of metal and a solder pad located within said opening, said solder pad being electrically isolated from said metal layer and a small hole through said solder pad extending to said printed circuit.

4. The printed circuit board arrangement of claim 3, including an electrical component soldered to said solder pad and electrically connected to said printed circuit.

5. A printed circuit board arrangement comprising:
   a substrate;
   a first layer of metal on said substrate;
   a first layer of dielectric material on said first layer of metal;
   at least two printed circuits on said first layer of dielectric material;
   a second layer of dielectric material on said first dielectric layer and on said at least two printed circuits;
   a second layer of metal on said second layer of dielectric material; and
   a metal clad opening surrounding said at least two printed circuits and electrically connected to said first and second layers of metal.

6. The printed circuit board arrangement of claim 5, including a gap in said metal clad opening.

7. The printed circuit board arrangement of claim 5, including at least a third printed circuit between said first and second layers of dielectric material, and a second metal clad opening between said at least two printed circuits and said at least a third printed circuit, said second metal clad opening being electrically connected to said metal clad opening.

8. The printed circuit board arrangement of claim 5, including an opening in said second layer of metal, a solder pad located therewithin and electrically isolated from said second metal layer and a microvia through said solder pad extending to a first printed circuit of said at least two printed circuits.

9. The printed circuit board arrangement of claim 8, including an electrical component soldered to said solder pad and electrically connected to said first printed circuit.

10. A printed circuit board arrangement comprising:
    an insulating substrate;
    a plurality of printed circuits on said insulating substrate;
    a layer of dielectric material covering said insulating substrate and said plurality of printed circuits;
    a layer of metal deposited on said layer of dielectric material; and
    a metal clad opening surrounding said plurality of printed circuits, said metal clad opening being electrically connected to said layer of metal.

11. The printed circuit board arrangement of claim 10, including an opening in said layer of metal and a solder pad located within said opening, said solder pad being electrically isolated from said metal layer and a microvia through said solder pad extending to a first printed circuit of said plurality of printed circuits.

12. The printed circuit board arrangement of claim 11, including an electrical component soldered to said solder pad and electrically connected to said first printed circuit.

* * * * *